United States Patent
Ramachandra Reddy (10) Patent No.: US 8,150,343 B2
(45) Date of Patent: Apr. 3, 2012

(54) DYNAMIC STABILITY, GAIN, EFFICIENCY AND IMPEDANCE CONTROL IN A LINEAR/NON-LINEAR CMOS POWER AMPLIFIER

(75) Inventor: Vijay Ramachandra Reddy, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 351 days.

(21) Appl. No.: 12/617,647

(22) Filed: Nov. 12, 2009

(65) Prior Publication Data

US 2011/0070848 A1    Mar. 24, 2011

Related U.S. Application Data

(60) Provisional application No. 61/244,215, filed on Sep. 21, 2009.

(51) Int. Cl.
*H01Q 11/12* (2006.01)

(52) U.S. Cl. ............ 455/127.2; 455/107; 455/108; 455/127.1; 455/115.1

(58) Field of Classification Search ............ 455/91, 455/127.2, 107, 113, 114.2, 115.1, 108, 127.3, 455/127.1, 13.4, 23, 67.11, 67.13, 69, 126
See application file for complete search history.

(56) References Cited

U.S. PATENT DOCUMENTS

| | | | |
|---|---|---|---|
| 6,449,465 B1 * | 9/2002 | Gailus et al. | 455/126 |
| 7,702,299 B2 * | 4/2010 | Matsuura et al. | 455/108 |
| 7,917,105 B2 * | 3/2011 | Drogi et al. | 455/126 |
| 2006/0040623 A1 * | 2/2006 | Kraut et al. | 455/108 |
| 2007/0184793 A1 * | 8/2007 | Drogi et al. | 455/127.1 |
| 2009/0054018 A1 * | 2/2009 | Waheed et al. | 455/126 |

* cited by examiner

*Primary Examiner* — Pablo Tran
(74) *Attorney, Agent, or Firm* — Garlick & Markison (57) ABSTRACT

A power amplifier (PA) provides dynamic stability and gain control for linear and non-linear operation. The PA operates with a baseband processor and a transmitter, in which the PA receives a signal from the transmitter for power amplification prior to transmission of the signal. The PA is configured to select between the linear mode of operation and the non-linear mode of operation, in which device scaling within the PA is achieved by changing a device sizing of at least one stage of the PA. Further to changing the device size, the PA changes biasing resistance and impedance of a matching network in response to the changing of the device size to control power output and stability for the PA.

20 Claims, 8 Drawing Sheets

DYNAMIC STABILITY, GAIN, EFFICIENCY AND IMPEDANCE CONTROL IN A LINEAR/NON-LINEAR CMOS POWER AMPLIFIER

CROSS REFERENCE TO RELATED APPLICATION

This application claims the benefit of priority to U.S. Provisional Application having an application No. 61/244,215, filed Sep. 21, 2009, and titled "Dynamic stability and gain control in a linear/non-linear CMOS power amplifier" which is incorporated herein by reference in its entirety.

BACKGROUND OF THE INVENTION

1. Technical Field of the Invention

The present invention relates generally to radio frequency (RF) power amplifiers and, more particularly, to CMOS, FET, SOS and/or SOI power amplifiers that provide linear and non-linear amplification capability from the same PA.

2. Description of Related Art

Communication systems are known to support wireless and wire lined communications between wireless and/or wire lined communication devices. Such communication systems include national and/or international cellular telephone systems, the Internet, and point-to-point in-home wireless networks. Each type of communication system is constructed, and hence operates, in accordance with one or more communication standards or protocols. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wideband CDMA (WCDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and extensions and/or variations thereof.

Depending on the type of wireless communication system, a wireless communication device, such as a mobile or cellular telephone, two-way radio, personal digital assistant (PDA), personal computer (PC), laptop computer, home entertainment equipment, RFID reader, RFID tag, as well as others, communicates directly or indirectly with other wireless communication devices. For direct communications (also known as point-to-point communications), the participating wireless communication devices tune their receivers and transmitters to the same channel or channels (e.g., one of the plurality of RF carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other network.

For each wireless device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more signal conversion stage(s) and a data recovery stage. The transmitter includes a data processing stage, one or more frequency conversion stage(s) that may include a modulator, and a power amplifier. The power amplifier amplifies the RF signal prior to transmission via an antenna.

One of the key stages for transmission is the power amplifier (PA). PAs provide the necessary power amplification for transmitting the RF signal. The power provided by the PA typically depends on the particular wireless communication technology employed, the standard or protocol being utilized and the distance and/or medium that the transmitted signal traverses to an intended receiving device. For example, Bluetooth™ devices transmit at lower power than cell phones, because the distance between Bluetooth™ wireless communication is much shorter than the distance between a cell phone and a base station, such as a cell phone tower. Thus, the size of a PA, which relates directly to its power generation capability, depends on the power required for transmission.

Furthermore, PAs are designed or configured to operate either in a linear mode or a non-linear mode. Linear PAs are widely used to transmit varying amplitude signals, such as OFDM (Orthogonal Frequency-Division Multiplexing), 8PSK (8 Phase Shift Keying), etc., in which the PA operates in class A, A/B, C, E, F etc. Linear PAs generally provide linear amplification of an input signal, but with reduced efficiency. Alternatively, non-linear PAs operate in class B, C, D or E to provide non-linear amplification, but with better power efficiency.

In constructing a PA, the PA is typically designed to provide power amplification for a particular purpose and the ability to provide a certain amount of transmitted power. For example, an integrated circuit that contains a PA may be selected for a mobile device (e.g. cell phone) based on the standard or protocol used for wireless communication and the linear or non-linear operation of the PA may be dictated by the specifications of the standard or protocol. If linear operation is to be practiced, the PA is designed accordingly. Similarly, if non-linear operation is to be practiced, the PA is designed accordingly.

In some instances, a device may support two different communication protocols that require the PA to switch between linear and non-linear modes of operation. For example, GSM uses a constant amplitude modulation, so that a non-linear PA may be employed to provide upwards of 45% efficiency. However, when the same PA is utilized for EDGE/WCDMA, which uses phase and amplitude modulation, the PA is backed off into a linear range. This transition of the operating mode of the PA may reduce the efficiency to around 20%, or even less. Because the PA is typically the single largest consumer of current and PAs are usually optimized for the higher power mode, this reduction in efficiency results in significant waste of power. Generally, prior art practice has been to accept this power loss in efficiency at low-power linear amplification.

Therefore, a need exists for a PA to provide both linear and non-linear amplification capability and in which better PA efficiency is obtained when operating in the linear mode.

SUMMARY OF THE INVENTION

The present invention is directed to apparatus and methods of operation that are further described in the following Brief Description of the Drawings, the Detailed Description of the Invention, and the Claims. Other features and advantages of

DETAILED DESCRIPTION OF THE INVENTION

The embodiments of the present invention may be practiced in a variety of settings that utilize a power amplifier (PA). The described embodiments below pertain to PAs that are utilized with a baseband processor and a radio frequency (RF) transmitter to provide transmission signals for wireless communication. However, the invention need not be limited to this use only and the invention may be implemented for use in other techniques. Furthermore, although the PAs are described as integrated in an integrated circuit device, the invention may be practiced without such integration. Similarly, the PAs are described as integrated using CMOS (Complementary Metal-Oxide-Semiconductor) technology, however, other manufacturing techniques may be used as well (such as Field-Effect-Transistor (FET), Junction-gate Field-Effect-Transistor (JFET), Laterally Diffused Metal-Oxide-Semiconductor (LDMOS), Silicon-On-Sapphire (SOS), Silicon-On-Insulator (SOI), Silicon-Germanium (SiGe) technologies, etc.). The embodiments described below are for exemplary purpose and other embodiments may be readily implemented to practice the invention.

Figure 1:
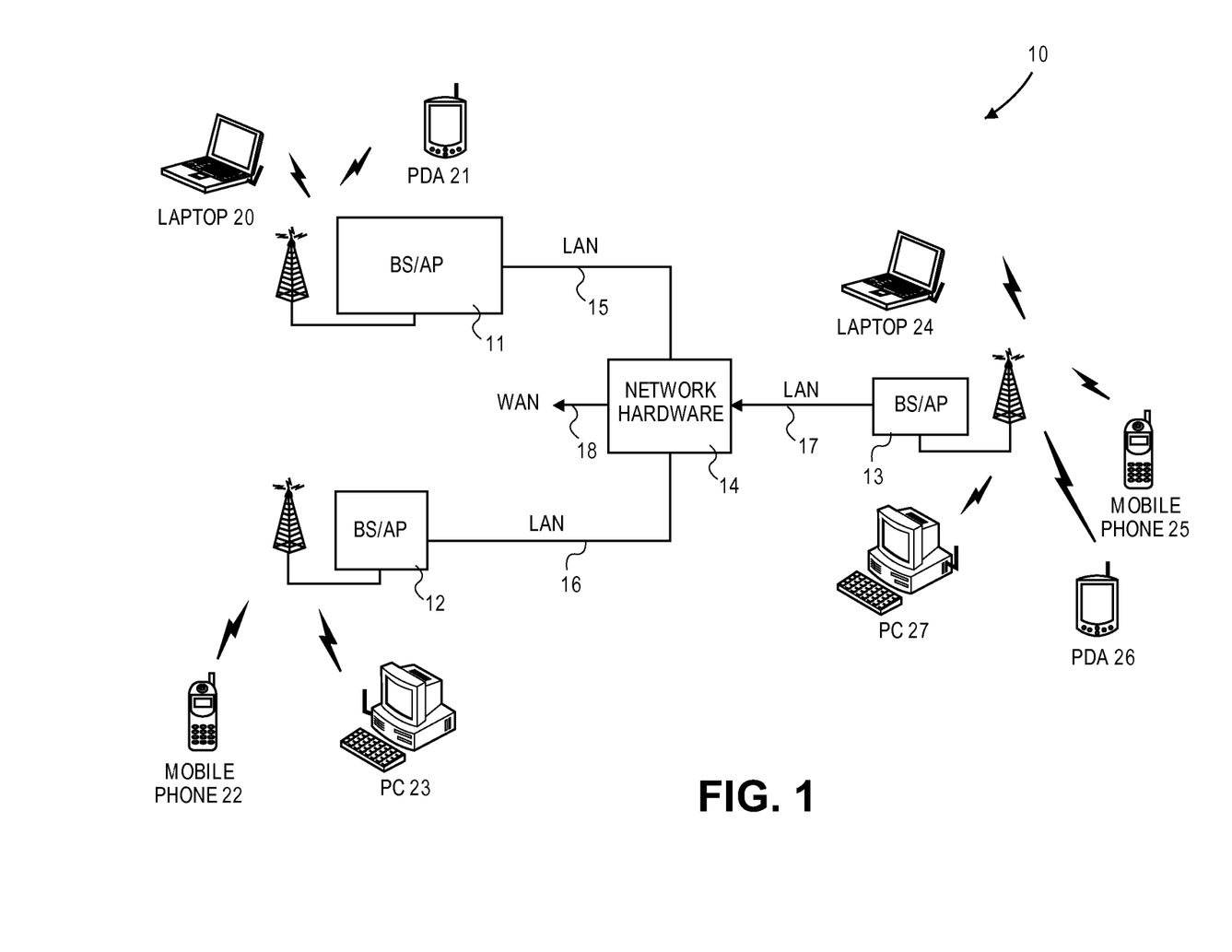
FIG. 1 is a block diagram of a wireless communication system, wherein a device within the system may implement the present invention.

FIG. 1 illustrates a block diagram of a communication system 10 that includes a plurality of base stations (BS) and/or access points (AP) 11, 12, 13, a plurality of wireless communication devices 20-27 and a network hardware component 14. The wireless communication devices 20-27 may be laptop computers 20, 24, personal digital assistants (PDAs) 21, 26, personal computers (PCs) 23, 27 and/or mobile (e.g. cellular) telephones 22, 25. These devices 20-27, via corresponding BS/AP 11-13, may be coupled to one or more networks 15-18 which allow communication between the devices.

In the example of FIG. 1, BSs/APs 11-13 are operably coupled to network hardware component 14 via local area network (LAN) connections 15, 16, 17. The network hardware component 14, which may be a router, switch, bridge, modem, system controller, etc., provides a wide area network (WAN) connection 18 for the communication system 10. Each of the BS/AP 11-13 has an associated antenna or antenna array to communicate with the wireless communication devices in its area. Typically, the wireless communication devices register with a particular BS/AP 11-13 to receive services from the communication system 10. For direct connections (i.e., point-to-point communications), wireless communication devices may communicate directly via an allocated channel. It is to be noted that system 10 of FIG. 1 is presented as an example only and that other system and devices may be implemented to practice the present invention.

The various devices, as well as BSs/APs, shown in FIG. 1 have a wireless transmitter if the communication is to be achieved wirelessly. A PA is generally resident in a transmitter to provide the power amplification to transmit a signal. Thus, for one or more devices shown in system 10, a PA implementing an embodiment of the present invention may be utilized to provide the power amplification for transmitting a wireless signal. Generally, this transmission is a radio frequency (RF) signal, but the invention need not be limited to a specific frequency range (such as RF).

Figure 2:
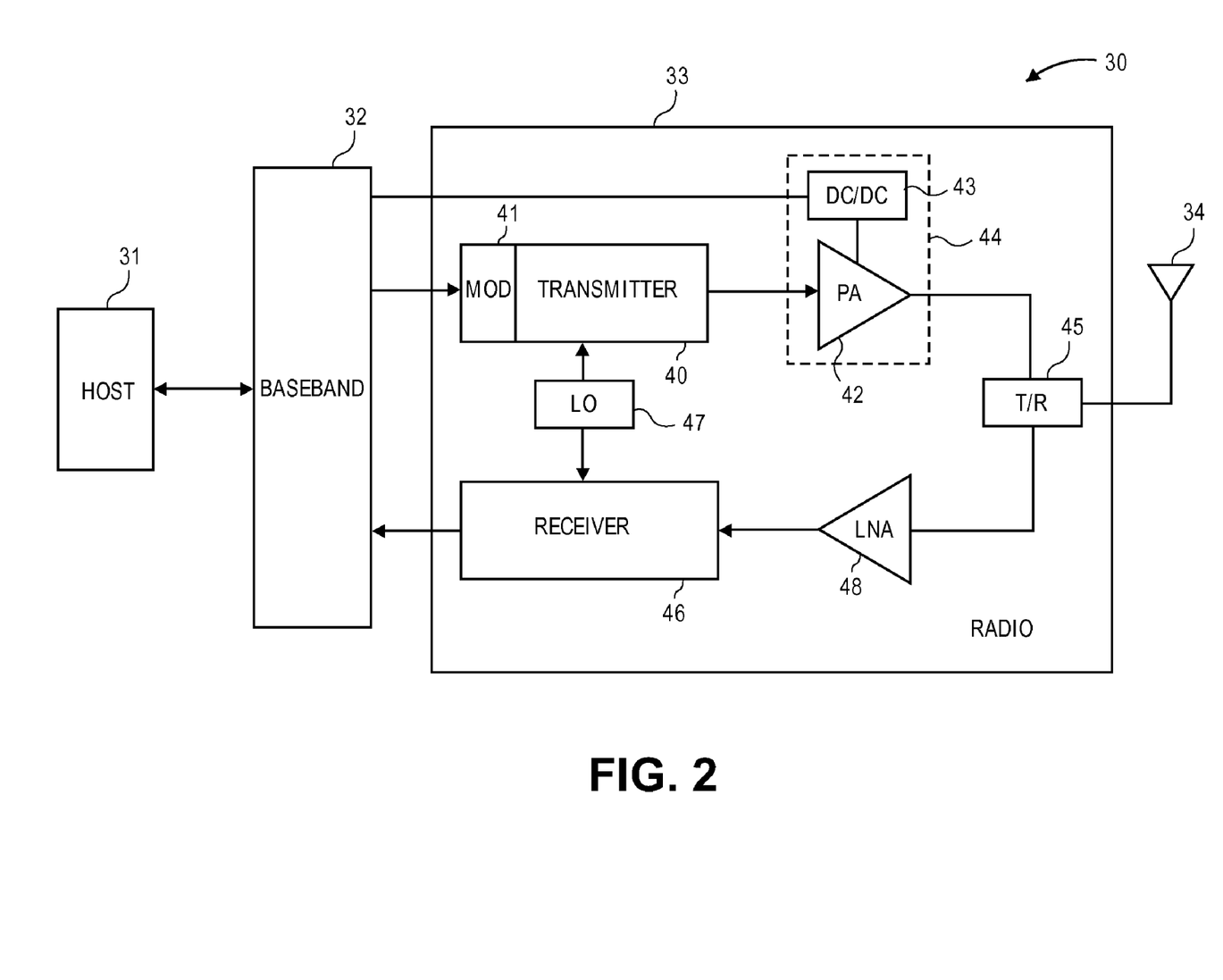
FIG. 2 is a block schematic diagram of a wireless communication device showing one embodiment of a device for practicing the present invention.

FIG. 2 illustrates a block schematic diagram of a wireless communication device 30 that includes a host module 31, baseband processing module 32 and radio module 33. For mobile telephones, radio 33 is typically a built-in component. For PDAs, laptops and/or PCs, radio 33 may be built-in or may be an externally coupled component.

Host module 31 generally includes those components that are utilized to provide a host function for device 30. Accordingly, host module 31 may include or couple to various user interfaces, including, but not limited to, displays, hand operated devices (e.g. keyboards, keypads, mice, touchpads), speakers, headphones, microphones, etc. Host module 31 may also include a processor (e.g. central processing unit or CPU, micro-controller, etc.), memory and/or other components to provide the processing functions to operate device 30. For example, when device 30 is a cell phone, host module 31 performs the corresponding communication functions in accordance with a particular cellular telephone standard or protocol.

Baseband processing module 32 couples host module 31 to radio 33 and provides baseband processing functions for both outgoing and incoming signals. For outgoing signals from host module 31, baseband processing module provides baseband processing of the outgoing signal and couples the outgoing digital signal for RF conversion by radio module 33. For incoming signals, radio module 33 converts an incoming RF signal to a digital baseband signal and couples the incoming signal to baseband processing module 32 for further processing for use by host module 31. Although radio module 33 and baseband module 32 may be constructed as separate components, in one embodiment, both modules 32, 33 are integrated on the same integrated circuit chip. In one embodiment, this integrated circuit is constructed using CMOS technology. In some embodiments, host module 31, or portions of host module 31, may also be integrated on the same integrated circuit chip.

Transmitter section of radio module 33 includes a transmitter module 40, which typically includes a modulator module 41, a PA module 42, and direct current/direct current (DC/DC) interface module 43. In some embodiments DC/DC interface module 43 may be part of PA module 42, as shown by dotted line 44. In other embodiments DC/DC interface module 43 may be distinctly separate from PA module 42. Still in other embodiments, DC/DC interface module 43 may not be present at all. In some embodiments, there may be more than one DC/DC interface module 43, such as one DC/DC interface module 43 for each stage of PA module 42. Receiver section of radio module 33 includes a low-noise amplifier (LNA) module 48 and receiver module 46. A local oscillator (LO) module 47, which typically includes an oscillator or a frequency synthesizer, provides local oscillation frequencies to transmitter module 40 and receiver module 46 for mixing or conversion operations. A transmit/receive (T/R) switch 45 provides the switching for coupling antenna 34 to either the receive side during receive operations or to the transmit side during transmit operations. It is to be noted that a first antenna may be used for transmitting and a separate second antenna for receiving, or multiple transmit/receive antennae for multiple antenna operations, such as for multiple-input-multiple-output (MIMO) communication.

For receiving a signal, an inbound signal is received by antenna 34 and coupled to LNA module 48 via T/R switch 45. LNA module 48 typically includes a low-noise amplifier for amplifying the incoming signal prior to down-conversion by receiver module 46. A variety of down-conversion or detection techniques, including direct conversion techniques, may be used to convert the incoming analog signal, which may be RF, to a digital signal for coupling to baseband processing module 32.

For transmitting a signal, an outbound signal from baseband processing module 32 is sent to transmitter module 40. Typically, a modulator within modulator module 41 provides some form of modulation, such as by use of a sigma-delta (ΣΔ) modulation technique, to convert the digital baseband signal to analog form (e.g. RF). As will be described below, in one embodiment, transmitter module 40 provides a modulated signal of varying amplitude and phase as an input to PA module 42, when in a linear mode of operation, and provides a constant amplitude signal from the transmitter module 40, when in a non-linear mode of operation, but a modulated envelope is provided on a supply line via DC/DC interface module 43 to at least one stage of the PA module 42. Then, PA module 42, which includes one or more stages of power amplification, provides the requisite power output for coupling to antenna 34. As noted above, depending on the embodiment, PA module 42 may include one or more DC/DC interface module(s) 43. DC/DC interface module 43 provides the interface between baseband processing module 32 and one or more stages of PA module 42 to vary the supply voltage to a PA stage and, in one instance, to provide a modulated envelope on the supply line to one or more PA stages for polar modulation of the output signal from PA module 42.

It is to be noted that various PAs, having one amplification stage or multiple amplification stages, may be implemented within PA module 42. However, the embodiments of the PAs implementing the present invention are capable of operating in both linear and non-linear modes of operation, in which the two modes of operation may be dynamically switched. As noted in the background section above, linear operation of an amplifier includes classes A, A/B, F (as well as other classes). Likewise, non-linear operation of an amplifier includes classes B, C, D or E (as well as other classes). Accordingly, the PA of the present invention may operate in class A, A/B or F when operating in the linear mode and class B, C, D or E when operating in the non-linear mode.

Figure 3:
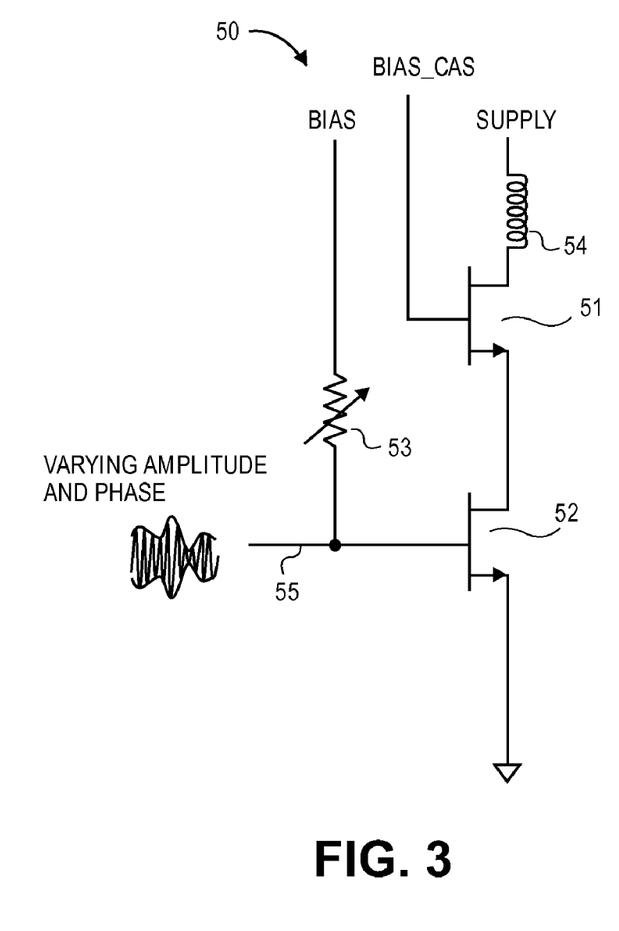
FIG. 3 is a circuit schematic diagram of a PA stage in a linear mode of operation and shows having a varying amplitude and phase signal at a gate terminal of an input transistor of the PA stage.

Furthermore, it is to be noted that the PAs implementing the present invention may utilize a variety of modulation schemes when operating in either of the two modes. FIG. 3 shows one modulation scheme that is utilized for linear operation. A circuit 50 is comprised of an input transistor 52 and a cascode transistor 51 arranged between a supply source and its return (e.g. ground) having a load component 54. Load component 54 is shown as an inductor, but other components may be used as a load for transistors 51, 52 instead. A biasing resistor 53 is coupled between the gate of transistor 52 and a biasing voltage noted as BIAS. In other embodiments, other components, such as a transmission line, inductor, etc., may be used instead of a resistor. The bias voltage BIAS is applied to the gate of transistor 52 and a separate biasing voltage BIAS_CAS is applied to the gate of cascode transistor 51. In some embodiments, a single biasing voltage may be used and applied to the gates of both transistors 51 and 52. Resistor 53 may be variable, so that a variable bias potential and/or variable resistance is placed on the gate of transistor 52. Proper biasing of transistor 52 ensures that circuit 50 operates in a linear mode. When operating in the linear mode, an analog signal having a varying amplitude and phase is coupled as an input to the gate of transistor 52. One example of linear operation is transmission using EDGE protocol for mobile phone communications.

Figure 4:
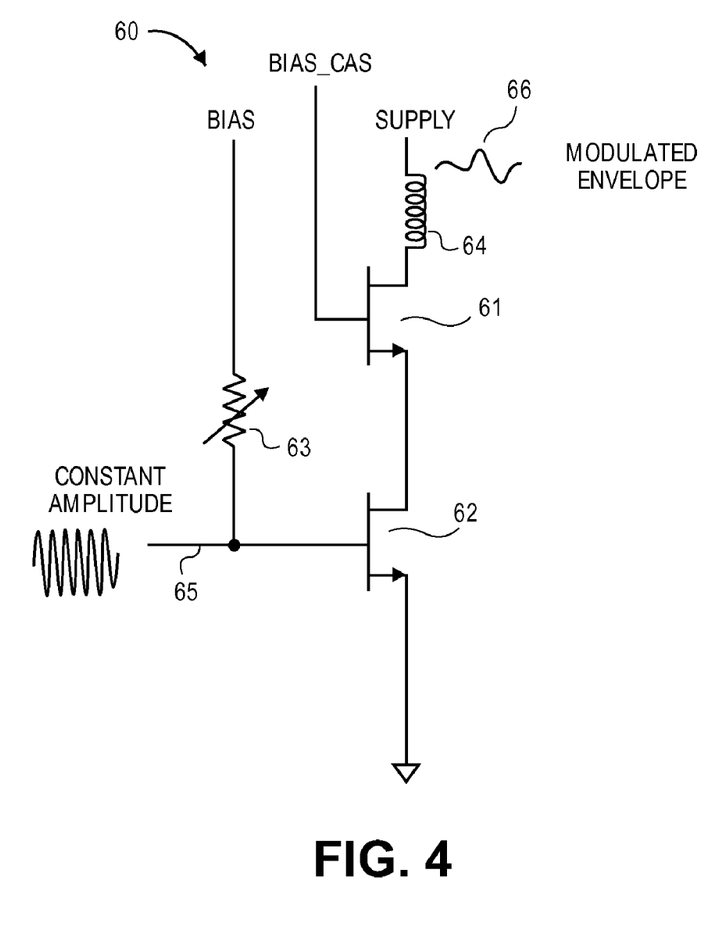
FIG. 4 is a circuit schematic diagram of a PA stage in a non-linear mode of operation and shows having a constant amplitude signal at a gate terminal of an input transistor of the PA stage and a modulated envelop on a supply line to the PA stage.

Alternatively, FIG. 4 shows one modulation scheme that is utilized for non-linear operation. A circuit 60 is equivalent to circuit 50 and is comprised of an input transistor 62 and a cascode transistor 61 arranged between a supply source and its return (e.g. ground) having a load component 64. Load component 64 is shown as an inductor, but other components may be used as a load for transistors 61, 62 instead. A biasing resistor 63 (or other circuit components as noted above for resistor 53) is coupled between the gate of transistor 62 and biasing voltage BIAS. The bias voltage BIAS is applied to the gate of transistor 62 and a separate biasing voltage BIAS_CAS is applied to the gate of cascode transistor 61. In some embodiments, a single biasing voltage may be used and applied to the gates of both transistors 61 and 62. Resistor 63 may be variable, so that a variable bias potential and/or variable resistance value is placed on the gate of transistor 62. Proper biasing of transistor 62 ensures that circuit 60 operates in a non-linear mode. When operating in the non-linear mode, an analog signal having a constant amplitude is coupled as an input to the gate of transistor 62, but a modulated envelope is provided on the supply line for polar modulation. One example of non-linear operation is transmission using GSM protocol for mobile phone communications.

Figure 5:
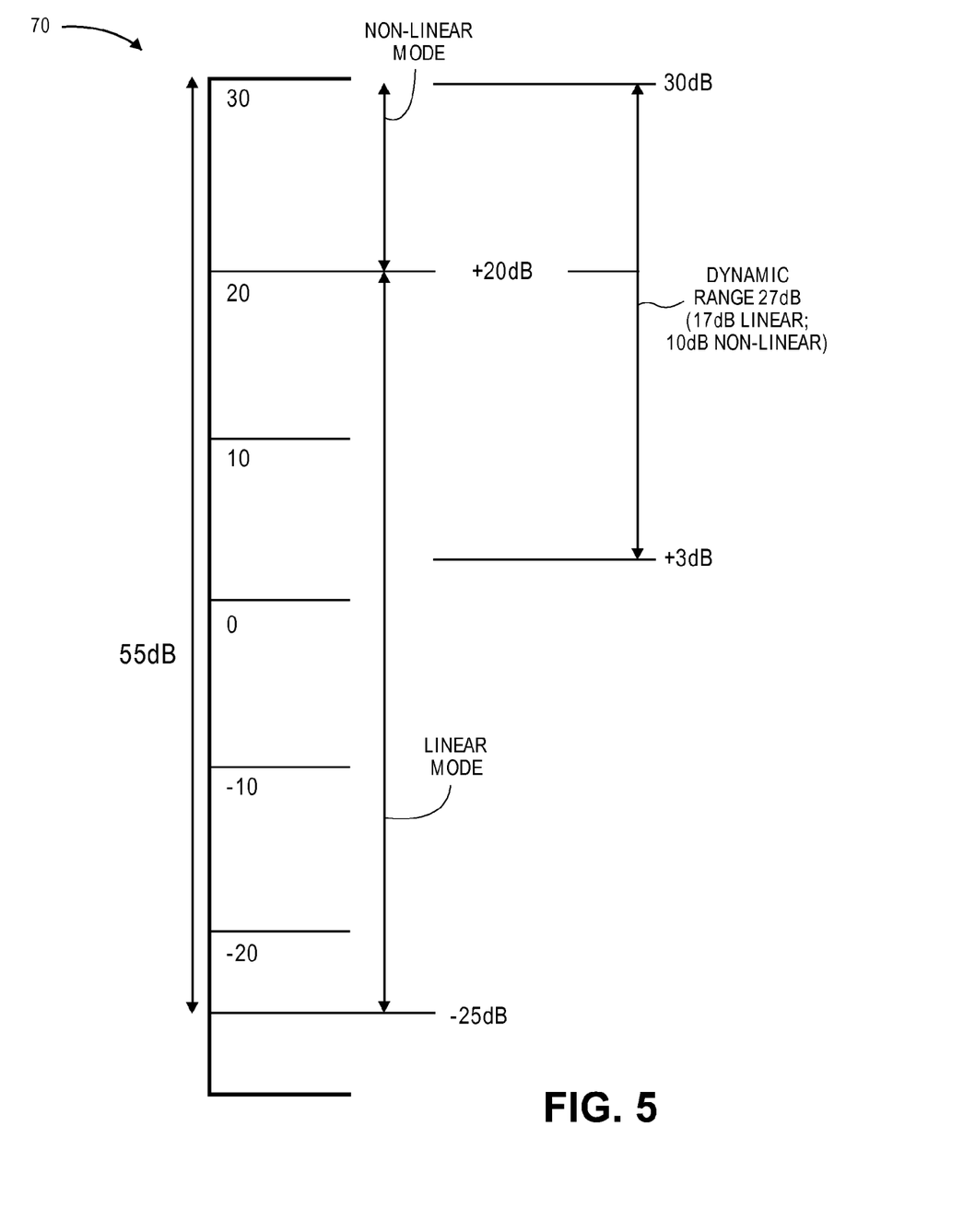
FIG. 5 is a power output graph for the PA and shows a linear range of operation and a non-linear range of operation for the PA in practicing one embodiment of the invention.

Because circuits 50 and 60 are equivalent, the same circuit may be used for both linear and non-linear amplification, provided adjustments are made between the two modes of operation to compensate for the differences in the operating parameters of the PA. Otherwise, efficiency drops significantly when switched to linear operation. For a given amplifier, such as that shown in FIGS. 3 and 4, more power output is obtained in non-linear operation versus linear operation, due to the higher efficiency of non-linear amplifiers. Accordingly, FIG. 5 shows a graph 70 to illustrate output power from a PA when the same PA is used for both linear mode of operation and non-linear mode of operation in practicing one embodiment of the invention. In FIG. 5 a −25 dB to +30 dB range is shown (55 dB total). The non-linear range is shown as +20 dB to +30 dB (effective 10 dB spread), and the linear range is below +20 dB. However, a bottom threshold is established for the linear range at +3 dB, so that the effective linear range is between +3 db to +20 dB (effective 17 dB spread), establishing an dynamic range of 27 dB for both linear and non-linear operation for the PA. It is to be noted that all values are approximate and in other embodiments, the values and ranges may differ considerably. Thus, by employing a dynamic power scale for a PA, where an upper range of the scale is used for non-linear operation and a lower range of the scale is used for linear operation, an amplifying circuit, such as that shown in FIGS. 3 and 4, may be utilized for both linear and non-linear modes of operation based on output power.

Figure 6:
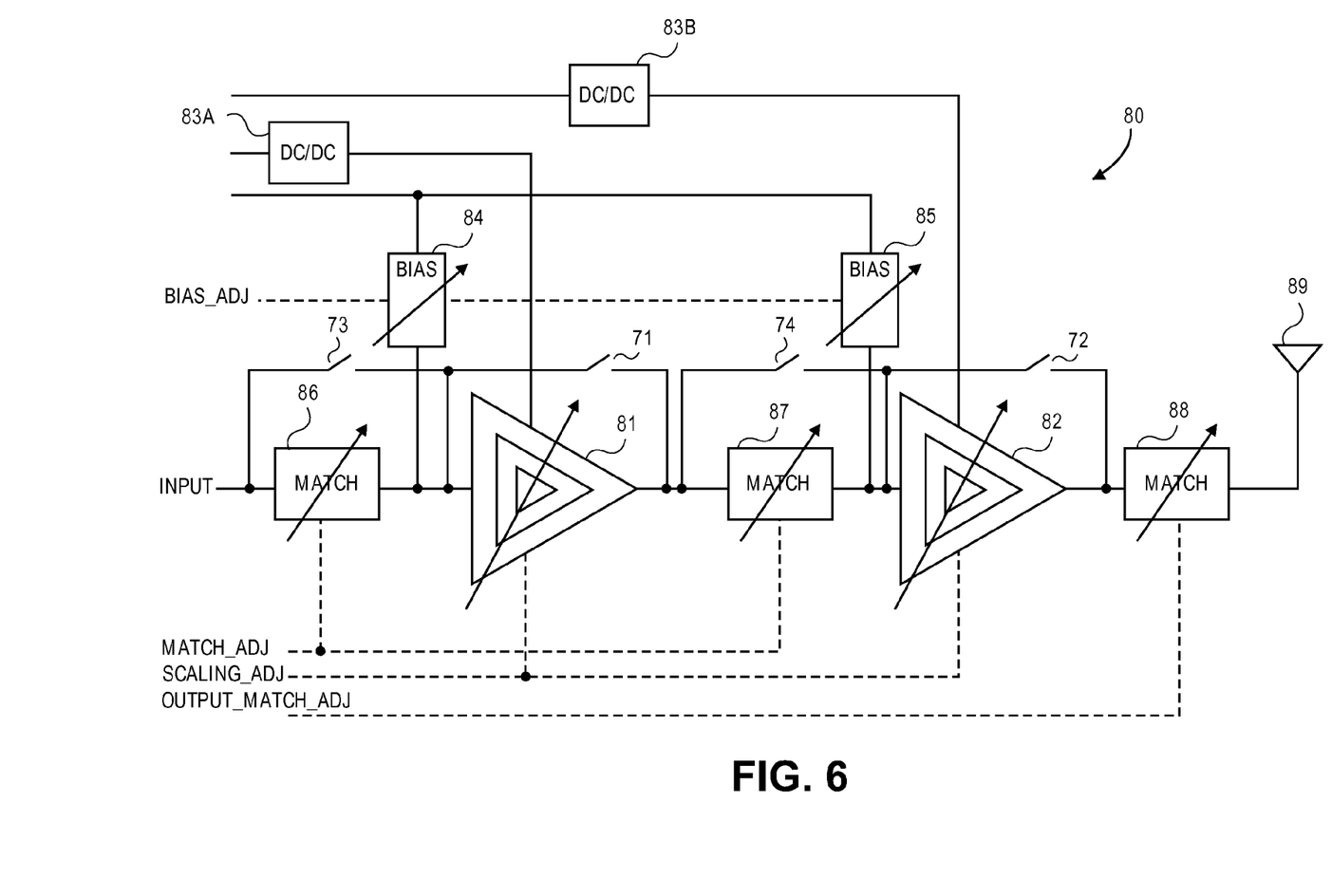
FIG. 6 is a block schematic diagram of a two-stage PA, in which device sizing, biasing and impedance matching for the stages are adjusted based on a mode of operation of the PA, as well as having the ability to bypass one or more of the PA stages.

FIG. 6 shows one technique for providing a PA that operates in both linear and non-linear modes. FIG. 6 shows a PA circuit 80 which may be used as one embodiment for implementing a PA of the present invention. PA 80 may be used for PA 42 (or 44) of FIG. 2. Likewise, DC/DC interfaces 83A, 83B are shown (collectively referred to as DC/DC interface 83 herein), in which DC/DC interface 83 may be utilized for DC/DC interface module 43 of FIG. 2. Similar to DC/DC interface module 43, DC/DC interface 83 may be part of PA 80 or may be separate from PA 80. PA 80 is shown having two stages of amplification by use of amplifier 81 (stage 1) and amplifier 82 (stage 2), but the actual number of such amplification stages is a design choice. Thus, some embodiments may have only one stage, while others may have more than two stages. In the two-stage PA of FIG. 6, a separate DC/DC interface is used for each of the PA stages. That is, DC/DC interface 83A operates with amplifier 81 and DC/DC interface 83B operates with amplifier 82 of the PA. However, as noted above, other embodiments may use just one such DC/DC interface 83 to operate with one, some or all stage(s) of PA 80.

Amplifier 81, 82 are each shown as scalable stages, wherein a device size may be scaled depending on the output power desired. For example, at higher power, a larger device is desired to draw more current to generate the requisite power output. At lower power, a smaller device is preferred since less power is required. The scaling of amplifiers 81, 82 allows for an appropriate device size to be selected for a given output power. By scaling an amplifier stage to the output power, a smaller device may be utilized when less power is required. Thus, for example, when PA 80 is operating in the dynamic power range noted in graph 70 of FIG. 5, amplifiers 81 and 82 may be scaled down in device size as the operating power is lowered. By reducing the device size at lower power, less power is wasted since the current required to operate the amplifiers decrease with the reduction in device size. Having a smaller device size also helps to reduce the feedthrough. It is to be noted that although both amplifiers 81, 82 are shown to have device scaling, other embodiments may have only the last stage of amplifier 82 scalable. With multiple stages, one, some or all stages may be scaled, depending on the embodiment implemented.

In one embodiment for practicing the invention, the device scaling of PA 80 is utilized only in the linear mode. That is, when PA 80 operates in a non-linear zone, maximum device sizing is used. When PA 80 transitions to linear operation, the device size is reduced as power requirements are reduced. The device size reduction is employed only in the linear mode for this embodiment, since the PA power efficiency in the non-linear mode is much better than when the PA is operating in the linear mode. At lower power, device scaling provides power control and offers reduced feedthrough and higher efficiency. In another embodiment, device scaling is used for both linear and non-linear modes of operation. Although device scaling has little effect (to a first order) with power control, it does affect capacitance, so that feedthrough may still be controlled. A device scaling adjust signal SCALING_ADJ is used to set the device scaling for each stage. The SCALING_ADJ signal is a control signal that is generated in the baseband processing module, or alternatively in the transmitter module.

As noted above, the point of operation for the PA is controlled by the biasing of the amplifier stage(s). Accordingly, a bias signal BIAS_ADJ is coupled to amplifiers 81, 82 to adjust the biasing of the stages, by use of biasing circuits 84, 85. One way to change the bias is to change the biasing resistance to change the value of the bias voltage. Thus, a bias adjust signal BIAS_ADJ is used to control biasing circuits 84, 85, which adjusts the respective bias voltage. Although a variety of biasing devices may be employed by biasing circuits 84, 85, to adjust the biasing resistance to adjust the bias voltage, in one embodiment, a bank of resistors are utilized and appropriate resistor values are switched in under control of the BIAS_ADJ signal to select an appropriate value for biasing respective circuits 84, 85. When the device size changes for amplifiers 81, 82, the values of resistance for biasing circuits 84, 85 change correspondingly to set the correct biasing for amplifiers 81, 82. In an alternative technique, the biasing voltage that is coupled is either fixed or variable, but wherein the adjustment to the biasing resistance is used to control stability. Since a small bias resistor for a smaller device size leads to a loss of power in the bias resistor and a large bias resistor for a large device size reduces stability, one embodiment compensates for this by increasing the bias resistance for smaller device sizes and decreases the bias resistance for larger device sizes. These changes may be achieved incrementally based on the device size that is selected to improve stability for the PA. Furthermore, it is to be noted that there may be separate biasing voltages employed, such as for the examples shown in FIGS. 3 and 4. Biasing circuits 84, 85 are shown to represent that the respective bias voltage and/or bias resistance to amplifiers 81, 82 may be adjusted, such as equivalently to the technique described in reference to FIGS. 3 and 4.

Furthermore, PA 80 has an adjustable matching network 86 at the input of amplifier 81 and an adjustable matching network 87 at the input of amplifier 82. An adjustable matching network 88 may be present in some embodiments at the output of the last amplifier stage of PA 80 that directly or indirectly couples to antenna 89. When amplifiers 81, 82 are scaled to change device sizing, the sizing reconfiguration may change the impedance of the amplifier as it is viewed from circuitry coupled to the amplifier. This change in impedance may be pronounced since coupling capacitance changes with the change in the device size. Accordingly, in order to provide the desired impedance matching, matching networks 86, 87 are adjusted by control signal SCALING_ADJ. Likewise, matching network 88 at the output of PA 80 is used to provide the impedance matching between the last amplifier stage and antenna 89. Furthermore, when operating in the non-linear mode, characteristics of the matching network(s) may be changed in order to perform wave-shaping on the signal.

A control signal MATCH_ADJ is used to adjust matching networks 86, 87. A control signal OUTPUT_MATCH_ADJ is used to adjust matching network 88. In some embodiments, MATCH_ADJ may be used to adjust matching network 88 as well, instead of using OUTPUT_MATCH_ADJ. The various control signals are typically generated as part of baseband processing (or alternatively by the transmitter module) when baseband processing determines the appropriate combination for selecting device size, biasing resistance and match network parameters for a particular transmission.

Additionally, in some embodiments for implementing PA 80, one, some or all of the PA stage(s) may be bypassed. The bypass functionality is represented by switches 71, 72 for the two-stage PA shown in FIG. 6. When switch 71 is open amplifier 81 is operable to function as an amplification stage and when switch 71 is closed, amplifier 81 is bypassed. Similarly, when switch 72 is open amplifier 82 is operable to function as an amplification stage and when switch 72 is closed, amplifier 82 is bypassed. In some embodiments, when switch 71 is closed, only the amplifier stage of amplifier 81 is bypassed and in other embodiments, the amplifier and either the preceding or following matching network are bypassed. In the shown example, matching network 86 is bypassed when switch 73 is closed. Switch 73 may be closed along with the closing of switch 71, so that both matching network 86 and amplifier 81 are bypassed. Similarly, in some embodiments, when switch 72 is closed to bypass amplifier 82, switch 74 is closed also to bypass matching network 87. Also, when both switches 71, 72 (as well as switches 73, 74) are closed, both stages may be bypassed.

It is to be noted that switches 71-74 are shown for functionality only and that in implementing the stage-bypass scheme described, the switches may be actual switches or other active or passive components. Although one switch is shown for each of the switches 71-74, generally multiple switches (or other components) are utilized to switch in or switch out relevant circuitry that provides a PA stage function. When a stage or stages is/are bypassed, the matching network(s) that remain, most likely need(s) to be adjusted to compensate for the bypass. A bypassing function, when implemented, allows for gain adjustments to be made by shutting off certain gain stages of the PA. Thus, for example, in a high gain mode, both amplifiers 81, 82 may be placed in the signal amplification path, but in a low gain mode, one of the stages (such as amplifier stage 82) may be bypassed so that the overall gain is lower than in the high gain mode. Other examples abound for bypassing one or more stages of PA 80.

Figure 7:
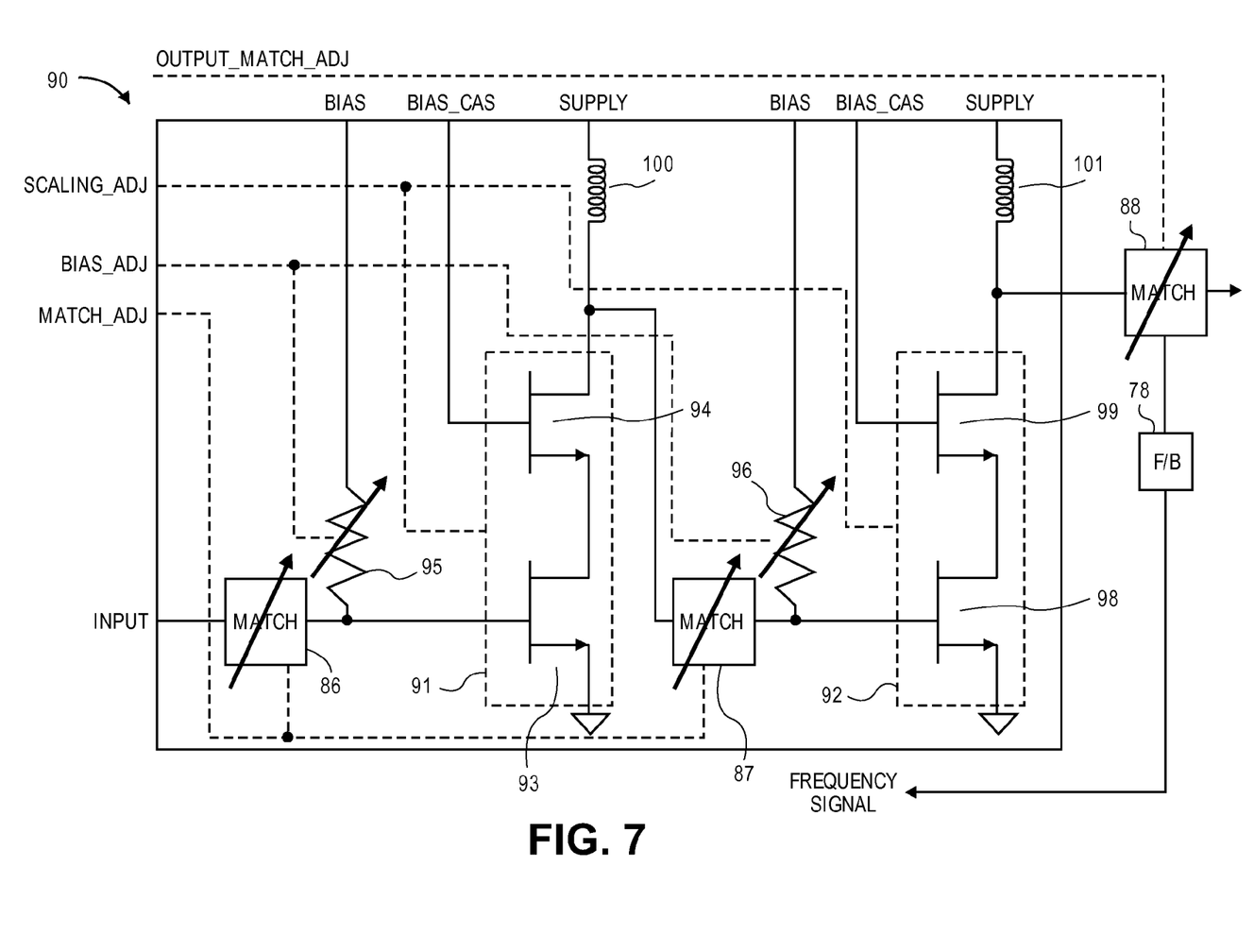
FIG. 7 is a circuit schematic diagram showing one embodiment of a transistor circuitry that is used for the two-stage PA of FIG. 6.

FIG. 7 shows a circuit 90 that may be used for circuit 80 of FIG. 6. Circuit 90 is one embodiment for implementing circuit 80 of FIG. 6. Circuit 90 includes a transistor circuit 91, comprised of input transistor 93 and cascode transistor 94, that is used for amplifier 81 of FIG. 6. An inductor 100 is present as a load for transistor circuit 91. Likewise a transistor circuit 92, comprised of input transistor 98 and cascode transistor 99, is used for amplifier 82 of FIG. 6. An inductor 101 is present as a load for transistor circuit 92. Although inductors 100, 101 are used as drain loads for transistor circuits 91, 92, other embodiments may use other loads, such as inductor-capacitor (LC) tank circuits or P-type transistors. A supply voltage SUPPLY is coupled to load inductors 100, 101. As shown in FIG. 6, separate supply voltages are coupled through respective DC/DC interfaces 83A, 83B to loads 100, 101.

A resistor 95 and resistor 96 correspond respectively to biasing circuits 84, 85 of FIG. 6. Although a variety of variable resistance devices may be used, in one embodiment the variable resistances are obtained by a bank of resistors and appropriate resistor values are switched in under control of the BIAS_ADJ signal. A bias voltage BIAS is coupled to PA 90 and to resistors 95, 96. By adjusting the resistance values of resistors 95, 96, the biasing resistance may be changed to stabilize circuit 90 based on device sizing. Alternatively, adjusting the resistance values may also control the bias voltage to the gates of input transistors 91, 92. Although the BIAS voltage may be coupled to the cascode transistors as well, in the shown example of FIG. 7, circuit 90 uses a second biasing voltage, noted as cascode biasing voltage BIAS_CAS, to bias cascode transistors 94, 99 (similar to FIGS. 3 and 4). This cascode biasing voltage may be fixed or varied. It is to be noted that BIAS_CAS could be a function of the drain or supply voltage to adjust the cascode gates for better reliability or efficiency. Using separate biasing voltages for input transistors 93, 98 and cascode transistors 94, 99, allows for independent controls in controlling the biasing of the transistor circuits 91, 92. Furthermore, although the same BIAS and BIAS_CAS may be applied to both the first and second transistor circuit stages, in other embodiments, separate voltages may be applied to each stage allowing for further independent control in biasing the stages.

The input to PA 90 is coupled to the gate of the first stage input transistor 91, via matching network 86. The output of the first stage at the drain of cascode transistor 94 is coupled as input to the gate of the second stage input transistor 98, via matching network 87. The impedance adjustment of the two matching networks 86, 87 are controlled by the MATCH_ADJ signal. The output from the second stage is coupled to output matching network 88, which is controlled by the OUTPUT_MATCH_ADJ signal. A feedback circuit 78 is employed in one embodiment to provide a feedback signal to baseband processor and/or control circuits in the transmitting section. The feedback signal allows for open loop or closed loop control of one or more transmitting parameters. Furthermore, although not shown, PA 90 may implement the PA stage bypassing technique described with reference to FIG. 6.

A variety of techniques may be used to change the impedance of the various matching networks, including the switching in and out of resistors, capacitors and/or inductors. In some embodiments, active devices may be present in the matching networks to adjust the impedance. The matching network(s) may be used to impedance match and/or waveshape by changing the components in one or more of the matching network(s). It is to be noted that adjustment(s) of one or more of the matching networks allows for one or more of the following schemes to be practiced: 1) switching the PA between high frequency and low frequency operation where the matching networks may be tuned for high band or low band; 2) allows frequency tuning within a single band or plurality of channels; 3) allows for load line (impedance) matching between low power (low gain) and high power (high gain) operation; 4) allows for voltage Standing Wave Ratio (VSWR) control under antenna mismatch; and 5) allows for tuning when switching among classes of operation (e.g. A, A/B, B, C, D, E, F, etc.). These are examples only and other techniques may be practiced.

Figure 8:
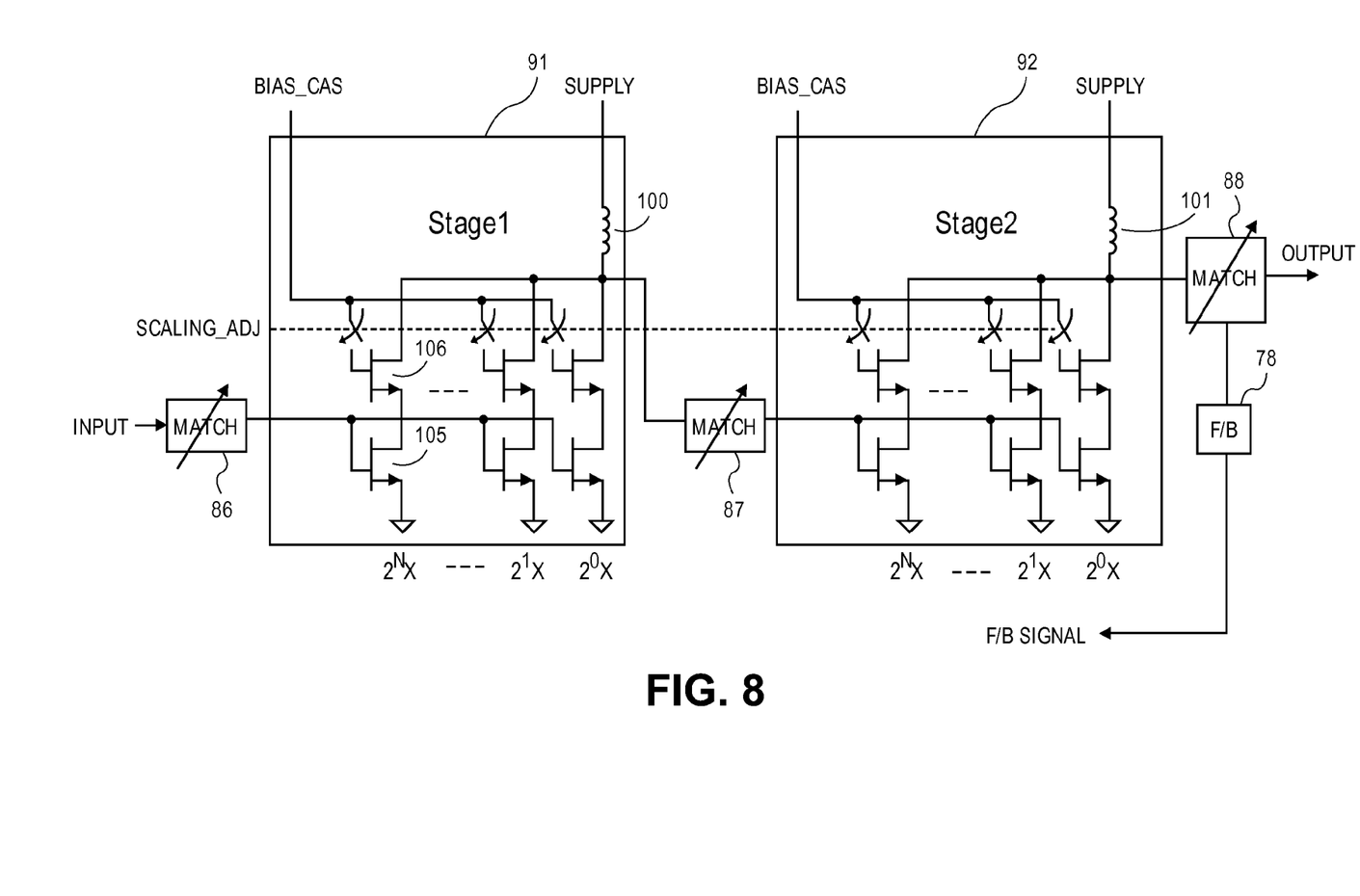
FIG. 8 is a circuit schematic diagram showing one technique of switching transistors in and out in the transistor circuitry of FIG. 7 to obtain device sizing for the two-stage PA.

With regard to transistor circuits 91, 92, although only two transistors are shown for each transistor circuit 91, 92, in actuality a plurality of transistors are present in each transistor circuit 91, 92. In operation, transistor circuits 91, 92 are controlled by the SCALING_ADJ signal to set the device sizing for each of the stages. Although a variety of techniques may be employed to change the size of the transistors that are operational in transistor circuits 91, 92, one embodiment to achieve device scaling is shown in FIG. 8. As noted in FIG. 8, each stage is comprised of a plurality of pairs of input and cascode transistors arranged in parallel, wherein BIAS_CAS to each of the cascode transistors is controlled by SCALING_ADJ. For minimum power output (smallest device scaling), only one leg is made conductive by closing only one switch in each stage. Subsequent switches are closed to couple BIAS_CAS to respective gates of the cascode transistors to turn on subsequent legs to incrementally increase the device scaling, until full device size is achieved when all switches are closed. It is to be noted that the weighting placed on each leg may have a variety of relationships. In one embodiment this weighting is done in binary increments, so that the weighting has the relationship of $2^0X, 2^1X, 2^2X \ldots 2^NX$, where X is used as a base current. In another embodiment, each leg may have equal weighting. Thus, by setting a particular weighting for the different transistor legs and controlling which switch or switches are to be closed, various combinations of current flow may be obtained, in which the current flow through each stage determines the device size for each stage.

In one embodiment, when PA 80 or 90 is operating in the non-linear mode at the higher power levels, all of the switches are closed for maximum device sizing. Subsequently, as power level requirements are reduced, switches are opened incrementally to reduce the device size by deactivating more legs of the input-cascode transistor pairs. At some point along this device scaling, a point is reached where linear operation is obtained. Further device sizing reduction lowers the power level of the PA. Still in another embodiment, full device sizing is utilized when in the non-linear mode of operation and device sizing is only implemented when the PA is to operate in the linear mode of operation.

It is to be noted that a variety of modulation schemes may be used to provide linear and non-linear modes of operation for the various PAs described herein. In one technique, the modulation scheme shown in FIG. 3 is used for linear operation and the modulation scheme of FIG. 4 is used for non-linear operation. In this non-linear modulation technique, the supply voltage may be modulated by the DC/DC interface to provide the modulated voltage on the SUPPLY line. Whit this polar modulation scheme, one or more stages may have the SUPPLY line modulated. However, in one embodiment with two stages, only the first stage is modulated, since the second stage amplifies this modulated signal. In one embodiment linear operation is used to transmit using EDGE protocol, while non-linear operation is used to transmit using GSM protocol.

Furthermore, the various control signals shown are typically generated as part of baseband processing (or alternatively by the transmitter module) when baseband processing module 32 determines the appropriate combination for selecting device size, biasing resistance and match network parameters for a particular transmission. In one embodiment, a look-up table within baseband processing module 32 of FIG. 2 cross references a number of parameters in a look-up table to access a size of the device so that correct scaling signals may be sent to the PA. A feedback circuit may update the lookup table by constantly updating the parameters. In low power situations or under certain other conditions, such feedback loops may be shut off to save power. In another embodiment the signal coming in may be pre-distorted to not only vary the supply, but also the various biasing points and device size. Such parameters may include, communication standard or protocol being used, channels being used, distance for the signal to be sent, noise level, minimum or maximum specified power, etc. After cross referencing the parameters in the table, a scaling size is determined.

Likewise, a separate look-up table may be used to determine the appropriate bias resistor value(s) and matching network setting(s), once device scaling is determined. This look-up table may take into account other factors (such as those noted above) as well. Still in another technique, both look-up tables may be consolidated into one look-up table.

Figure 9:
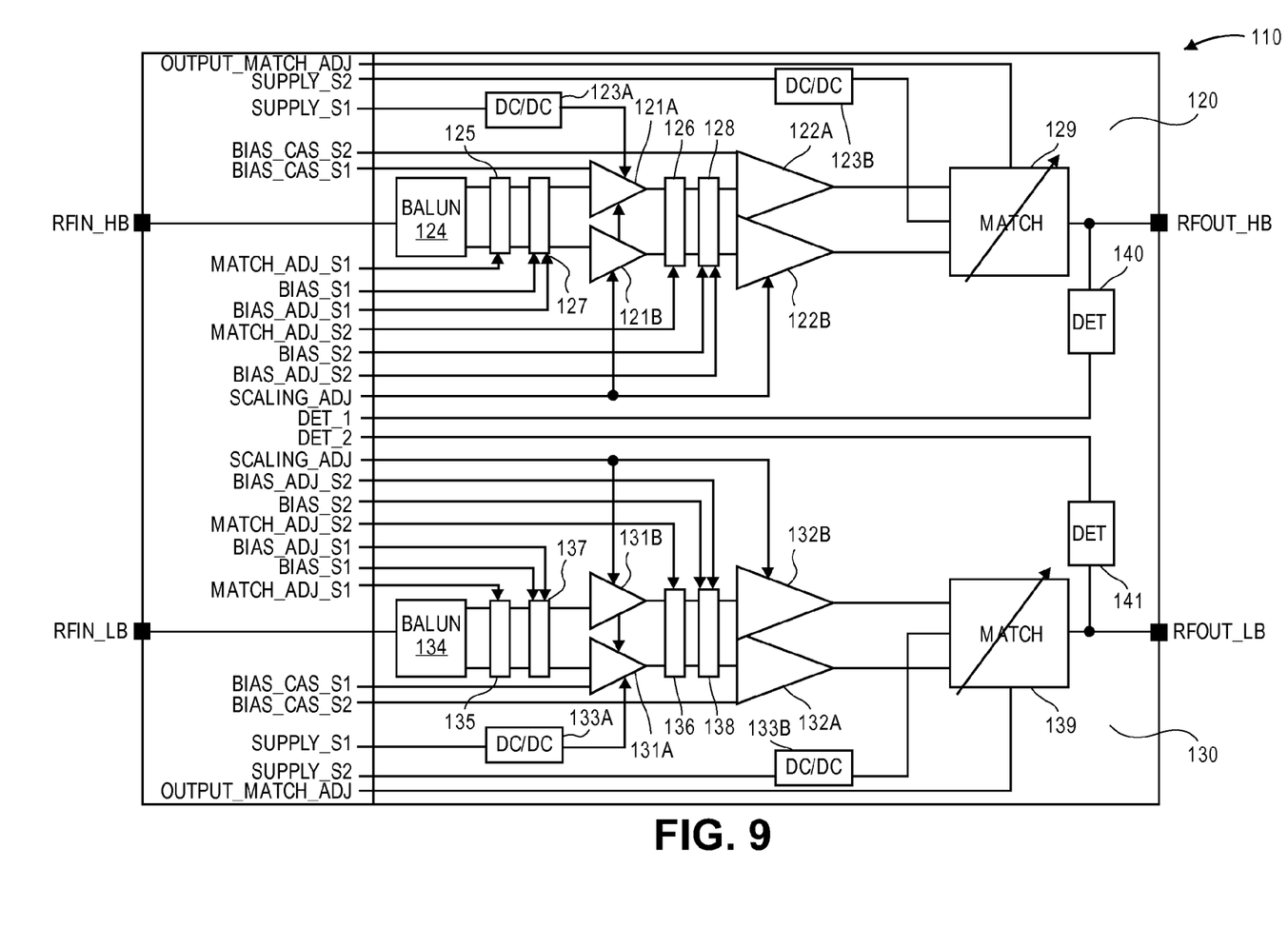
FIG. 9 is a block schematic diagram showing one embodiment of a dual-PA for providing separate PAs for two separate range of transmission frequencies.

It is to be noted that the PA circuits illustrated in FIGS. 3, 4 and 6-8 show a single ended configuration. However, it is understood that these circuits may be implemented differentially. Accordingly, FIG. 9 is shown with a differentially arranged PA. FIG. 9 shows a more comprehensive embodiment for practicing the present invention. PA 110 is actually two complete sections of PAs. A higher frequency PA 120 is shown in the upper portion of the schematic and a lower frequency PA is shown in the bottom portion. Both PAs 120, 130 are shown as differential amplifiers. For high frequency PA 120, the input signal is coupled through balun 124, through matching network 125 to inputs of the differential amplifiers 121A-B. with biasing circuit 127 providing the bias. Subsequently, the differential output of amplifiers 121 A-B are coupled to matching network 126 and to input of the second amplification stage comprised of amplifiers 122 A-B, with biasing circuit 128 providing the bias. The differential output of amplifier 122 A-B is coupled to matching network 129, which output is then coupled out for direct or indirect coupling to an antenna or antennae. The supply voltage SUPPLY_S1 to the first stage is coupled through a DC/DC interface 123 and this supply voltage is modulated for polar modulation. The supply voltage SUPPLY_S2 to the second stage is routed through output matching network 129. A detector 140 is used as an output to provide an output detection feedback to the baseband processing module and/or to the transmitter module.

The structure and operation of the lower frequency PA 130 is essentially identical to PA 120. Thus, the input signal is coupled through balun 134, through matching network 135 to inputs of the differential amplifiers 131A-B. with biasing circuit 137 providing the bias. Subsequently, the differential output of amplifiers 131 A-B are coupled to matching network 136 and to input of the second amplification stage comprised of amplifiers 132 A-B, with biasing circuit 138 providing the bias. The differential output of amplifier 132 A-B is coupled to matching network 139, which output is then coupled out for direct or indirect coupling to an antenna or antennae. The supply voltage SUPPLY_S1 to the second stage is coupled through a DC/DC interface 133 and this supply voltage is modulated for polar modulation. The supply voltage SUPPLY_S2 to the second stage is routed through output matching network 139. A detector 141 is used as an output to provide an output detection feedback to the baseband processing module and/or to the transmitter module.

The dual PA structure allows one integrated circuit chip to provide PAs designed for two different range of frequencies. For example, in one embodiment, a center frequency of operation may be set at approximately 1900 MHz and a second center frequency of operation may be set at approximately 900 MHz.

Accordingly, a PA having dynamic stability, gain, efficiency and impedance control may be constructed to operate in both linear and non-linear modes of operation. In one embodiment, the two modes of operation may be dynamically changed while the PA is in operation. Furthermore, the PA implementing the embodiments of the present invention may be constructed on a CMOS integrated circuit chip. Other techniques employing technologies, such as FET, JFET, LDMOS, SOS, SOI, SiGe, etc. may be practiced with the present invention. It is to be noted that various circuits, components, structures and modulation schemes are presented as examples and others may be readily implemented to practice the present invention, such as the described PA stage bypassing scheme.

Furthermore, various advantages may be obtained by implementing one or more of the embodiments of the invention. For example, bias (including cascode bias), resistor value, input matching network, interstage matching network, output matching network, device scaling, harmonic tuning, as well as other controls, may be controlled by the baseband, a control unit and/or active/passive circuit in the radio, with or without feedback. The control may be a function of feedback for pre-distortion control, such as by use of a look up table, etc. One goal is to be able to have better efficiency, power and performance under varying conditions. For example, the PA module may switch from linear to compressed mode, switch from one class to another (example Class A to Class E), switch from high power to low power mode, switch from high frequency to low frequency mode, etc. A use of DC/DC interface unit may enable polar operation and provide supply control for linear applications (efficiency enhancement) or both.

The use of matching networks, bias adjustment and other tunable units enable adjustments to be effected under different operating conditions. For example, in GSM the PA may be a switching amplifier and the matching circuit is optimized for max power and efficiency, the DC/DC interface may be bypassed and feedback turned off, the bias resistor may be set for max efficiency and biases adjusted for best GSM performance. When the PA is switched to EDGE mode, the PA is able to operate in Polar/Linear mode, in which the PA is scaled accordingly and matching reset to allow for the best impedance and harmonics.

Furthermore, adjusting the matching circuit allows the PA to switch between classes such as from Class E to linear operation. Feedback may be turned on to correct any errors and DC/DC interface may be turned on for polar operation efficiency enhancement. The PA feedback may also be dynamic and the feedback may be turned on at higher power levels and off at other power levels. The PA feedback may be turned on intermittently as well to provide correction only when needed. While the PA is operating in the WCDMA/CDMA/WLAN etc. mode, the various matching circuits may be tuned to offer the impedance and bandwidth that will allow the PA to operate in the optimum impedance level under backoff and/or VSWR conditions. Unwanted feedthrough is avoided by scaling the device size at lower supplies and by dynamically controlling the biases.

Thus, a power amplifier having dynamic stability, gain, efficiency and impedance control in a linear/non-linear mode is described.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

I claim:

1. An apparatus comprising:
  a baseband processing module to provide baseband processing to transmit a signal;
  a transmitter module coupled to the baseband module to modulate the signal from the baseband processing module; and
  a radio frequency (RF) amplifier module coupled to the transmitter module to receive the modulated signal and coupled to the baseband processing module to receive control signals from the baseband processing module to operate the RF amplifier module, wherein the RF amplifier module is operable to select between a linear mode of operation and a non-linear mode of operation in which the RF amplifier module is selectable to change device sizing of at least one stage of a RF amplifier circuit, change biasing of at least one stage of the RF amplifier circuit and change impedance of a matching network for at least one stage of the RF amplifier circuit, when switching between the non-linear and linear modes of operation.

2. The apparatus of claim 1, wherein the baseband processing module, transmitter module and the RF amplifier module are integrated on a complementary metal-oxide-semiconductor (CMOS) integrated circuit device.

3. The apparatus of claim 1, wherein the RF amplifier module includes a plurality of power transistors arranged in parallel and is operable to change device sizing by switching in and switching out one or more branches of the power transistors.

4. The apparatus of claim 1, wherein the RF amplifier module includes a bias resistor for each of the at least one stage where the biasing is changed, wherein when biasing is changed for the at least one stage, a corresponding bias resistance value of the bias resistor for that stage is changed.

5. The apparatus of claim 1, wherein the RF amplifier module also changes an impedance of a matching network at an output of the RF amplifier module to match an output of the RF amplifier module to an antenna.

6. The apparatus of claim 1, wherein the RF amplifier module receives a modulated signal of varying amplitude and phase from the transmitter module when in the linear mode of operation and receives a constant amplitude signal from the transmitter module, but a modulated envelope is provided on a supply line to at least one stage of the RF amplifier module for polar modulation, when in the non-linear mode of operation.

7. An apparatus comprising:
  a baseband processing module to provide baseband processing to transmit a signal;
  a transmitter module coupled to the baseband module to convert the signal from the baseband processing module to a radio frequency (RF) signal; and
  a power amplifier (PA) coupled to the transmitter module to receive the RF signal and coupled to the baseband processing module to receive control signals from the baseband processing module to operate the PA, wherein the PA is operable to select between a linear mode of operation and a non-linear mode of operation for the PA in which the PA has at least one stage that is selectable to change device sizing of a transistor circuit, change biasing of the transistor circuit and change matching network coupled to the transistor circuit, when switching between the non-linear and linear modes of operation.

8. The apparatus of 7 further including a supply control module to control a supply voltage coupled to the transistor circuit.

9. The apparatus of claim 8, wherein the transistor circuit includes a plurality of power transistors arranged in parallel and, under control of the baseband processing module, the PA is operable to change device sizing by switching in and switching out one or more branches of the power transistors in order for the PA to set a predetermined output power level that determines a mode of operation for the PA.

10. The apparatus of claim 9, wherein the transistor circuit includes a bias resistor coupled to an input of the transistor circuit, wherein when biasing is changed for the transistor circuit, a corresponding bias resistance value of the bias resistor is selected.

11. The apparatus of claim 10, wherein the matching network is coupled to the input of the transistor circuit and a matching impedance is changed based on the device sizing selected for the transistor circuit.

12. The apparatus of claim 11, wherein the PA also includes an adjustable output matching network at an output of the PA to adjust an output impedance to match an output of the PA to an antenna.

13. The apparatus of claim 11, wherein the baseband processing module, transmitter module and the RF amplifier module are integrated on a complementary metal-oxide-semiconductor (CMOS) integrated circuit device.

14. The apparatus of claim 11, wherein the PA has more than one stage that are selectable to change device sizing of a transistor circuit for that stage, change biasing of the transistor circuit for that stage and change matching network coupled to the corresponding transistor circuit for that stage, when switching between the non-linear and linear modes of operation.

15. The apparatus of claim 11, wherein the PA receives a modulated signal of varying amplitude and phase from the transmitter module when in the linear mode of operation and receives a constant amplitude signal from the transmitter module, but a modulated envelope is provided by the supply control module on a supply line to the transistor circuit for polar modulation, when in the non-linear mode of operation.

16. A method comprising:
receiving a baseband signal that is to be transmitted;
converting the baseband signal to a radio frequency (RF) signal in a radio transmitter;
coupling the RF signal to a power amplifier (PA) that is integrated on a complementary metal-oxide-semiconductor (CMOS) integrated circuit device;
selecting an operating mode for the RF signal that is to be transmitted, wherein the operating mode includes both a linear mode of operation for the PA and a non-linear mode of operation for the PA;
selecting a device size for the PA based on a selected output power and mode of operation of the PA;
selecting a biasing resistance value for the PA based on a selected output power and mode of operation of the PA;
selecting an impedance of a matching network for the PA based on a selected output power and mode of operation of the PA; and
transmitting an output signal from the PA.

17. The method of claim 16, wherein selecting the operating mode for the PA includes selecting a linear mode of operation when the baseband signal is converted to a modulated signal of varying amplitude and phase as an input to a PA and selecting a non-linear mode of operation when the baseband signal is converted to a constant amplitude signal for input to the PA and a modulated envelope is provided on a supply line to the PA for polar modulation.

18. The method of claim 17, wherein transmitting the output signal from the PA transmits using EDGE protocol when in the linear mode of operation and GSM protocol when in the non-linear mode of operation.

19. The method of claim 17, wherein selecting the device size includes using a look-up table to determine the device size.

20. The method of claim 17, wherein selecting the biasing resistance value and impedance of the matching network includes using a look-up table to determine the biasing resistance value and the impedance.

* * * * *